United States Patent
Pomaranski et al.

(10) Patent No.: US 6,985,826 B2
(45) Date of Patent: Jan. 10, 2006

(54) SYSTEM AND METHOD FOR TESTING A COMPONENT IN A COMPUTER SYSTEM USING VOLTAGE MARGINING

(75) Inventors: Ken G. Pomaranski, Roseville, CA (US); Andrew H. Barr, Roseville, CA (US); Dale J. Shidla, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 63 days.

(21) Appl. No.: 10/698,204

(22) Filed: Oct. 31, 2003

(65) Prior Publication Data
US 2005/0096863 A1    May 5, 2005

(51) Int. Cl.
G06F 19/00    (2006.01)

(52) U.S. Cl. ............... 702/120; 702/117; 702/119; 702/120; 714/25; 714/47

(58) Field of Classification Search ............... 702/186, 702/117, 118, 119, 120, 123; 714/25, 30, 714/40, 41, 47
See application file for complete search history.

(56) References Cited

U.S. PATENT DOCUMENTS

| | | | |
|---|---|---|---|
| 5,033,049 A | 7/1991 | Keener et al. | |
| 6,049,894 A | 4/2000 | Gates | |
| 6,182,248 B1 | 1/2001 | Armstrong et al. | |
| 6,351,827 B1 * | 2/2002 | Co et al. | 714/42 |
| 6,609,221 B1 | 8/2003 | Coyle et al. | |
| 6,654,707 B2 * | 11/2003 | Wynn et al. | 702/186 |
| 6,698,952 B1 * | 3/2004 | Goddard | 713/300 |
| 2004/0064273 A1 * | 4/2004 | Le et al. | 702/60 |
| 2004/0267482 A1 * | 12/2004 | Robertson et al. | 702/118 |
| 2004/0267483 A1 * | 12/2004 | Percer et al. | 702/118 |
| 2004/0267486 A1 * | 12/2004 | Percer et al. | 702/120 |
| 2005/0021260 A1 * | 1/2005 | Robertson et al. | 702/75 |

FOREIGN PATENT DOCUMENTS

| | | |
|---|---|---|
| EP | 0 715 716 | 6/1996 |
| GB | 1 255 441 | 12/1971 |
| GB | 1 361 141 | 7/1974 |
| GB | 2 125 973 | 3/1984 |
| GB | 2 403 826 | 1/2005 |
| JP | 5-20109 | 1/1993 |

OTHER PUBLICATIONS

A copy of GB Search Report for Application No. GB0423957.0 mailed on Feb. 8, 2005 (3 pages).

* cited by examiner

*Primary Examiner*—Patrick J. Assouad

(57) ABSTRACT

A computer system comprising a first processor that is configured to cause an operating system to be booted, a test module, a component coupled to the test module, and a power supply coupled to the test module and the component is provided. The test module is configured to provide a first signal to the power supply to cause a first voltage to be provided to the component, and the test module is configured to cause a first test to be performed on the component subsequent to the first voltage being provided to the component and the operating system being booted.

24 Claims, 4 Drawing Sheets

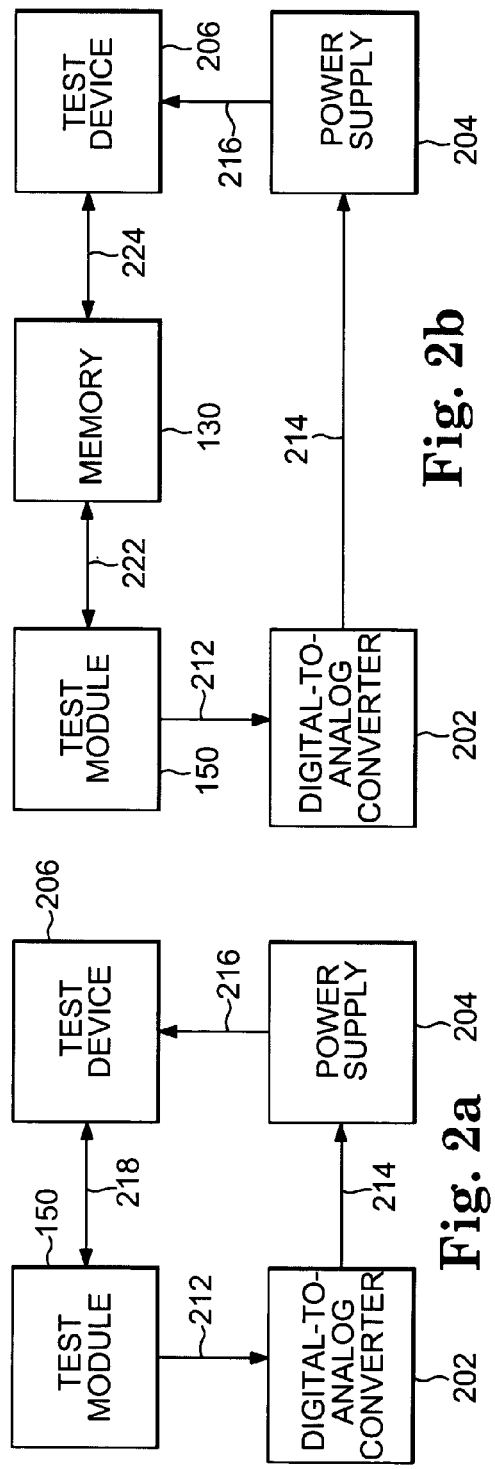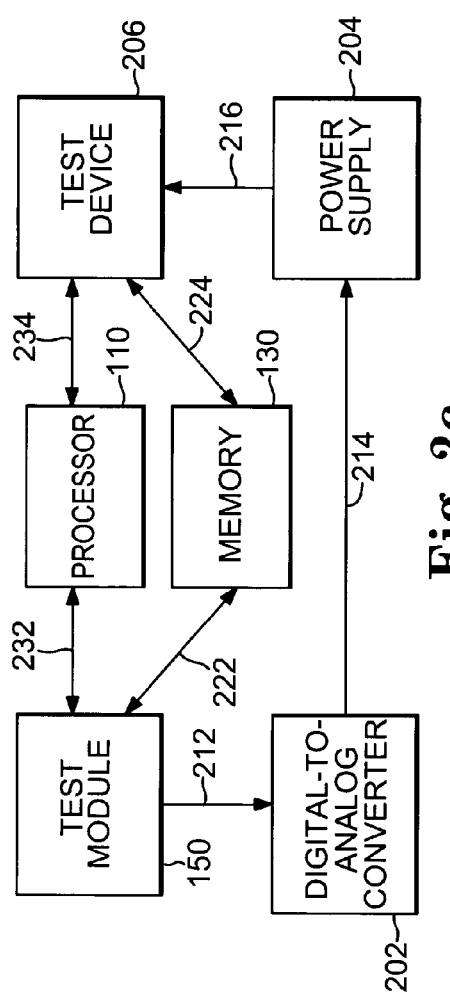

US 6,985,826 B2

SYSTEM AND METHOD FOR TESTING A COMPONENT IN A COMPUTER SYSTEM USING VOLTAGE MARGINING

BACKGROUND

Computer systems generally include a number of components that are electrically connected to one another. These components include one or more processors, memory devices, input/output (I/O) devices, and controllers for the memory and I/O devices. One or more power supplies in a computer system typically provide power to the components in the system. The power is generally provided to components using a constant, direct current (DC) voltage at a particular voltage level, e.g., 5.0 volts (V).

In efforts to ensure the reliability of a component, manufacturers often test components of a computer system over a range that is near the nominal operating voltage of the component. For example, a manufacturer may test a component over a range of +/−10% of an operating voltage of a component. By testing components at different voltage levels, manufacturers may identify components that fail at various voltage margins. Because components that fail at the voltage margins will likely eventually fail at the operating voltage, a manufacturer may label such components as defective.

In actual use in a computer system, the range of voltages where a component operates without failing may gradually narrow over time. In addition, a voltage level provided to a component by a power supply may vary with temperature or other environmental factors. Under certain circumstances, the voltage level provided to a component may fall outside of an operable voltage range of the component and the component may fail. Furthermore, components can weaken over time due to latent defects. As stated earlier, these defects can be detected early through voltage margining. Computer systems typically do not include mechanisms for testing components over a range of voltages during normal operation. As a result, component failures may not be detected until they cause undesirable results such as a crash of the computer system.

Accordingly, it would be desirable to be able to predict component failures in a computer system in a 'planned' manner before the failures cause undesirable results during operation of the system.

SUMMARY

According to one exemplary embodiment, a computer system is provided that includes a first processor that is configured to cause an operating system to be booted, a test module, a component coupled to the test module, and a power supply coupled to the test module and the component. The test module is configured to provide a first signal to the power supply to cause a first voltage to be provided to the component, and the test module is configured to cause a first test to be performed on the component subsequent to the first voltage being provided to the component and the operating system being booted. In another embodiment, such testing can occur during normal system operation. (i.e., when the computer is booted and running the operating system and applications.)

BRIEF DESCRIPTION OF THE DRAWINGS

FIG. 2a is a block diagram illustrating an embodiment of selected portions of the computer system shown in FIG. 1.

FIG. 2b is a block diagram illustrating an embodiment of selected portions of the computer system shown in FIG. 1.

FIG. 2c is a block diagram illustrating an embodiment of selected portions of the computer system shown in FIG. 1.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

In one aspect of the present disclosure, a computer system includes a test module configured to perform voltage margining tests on components of the computer system during operation of the computer system. To test a component, the test module causes the component to be de-allocated from use by the operating system and then performs tests on the component over a range of voltages. The test module detects any errors in response to the tests and causes remedial action to be performed in response to any errors.

Figure 1:
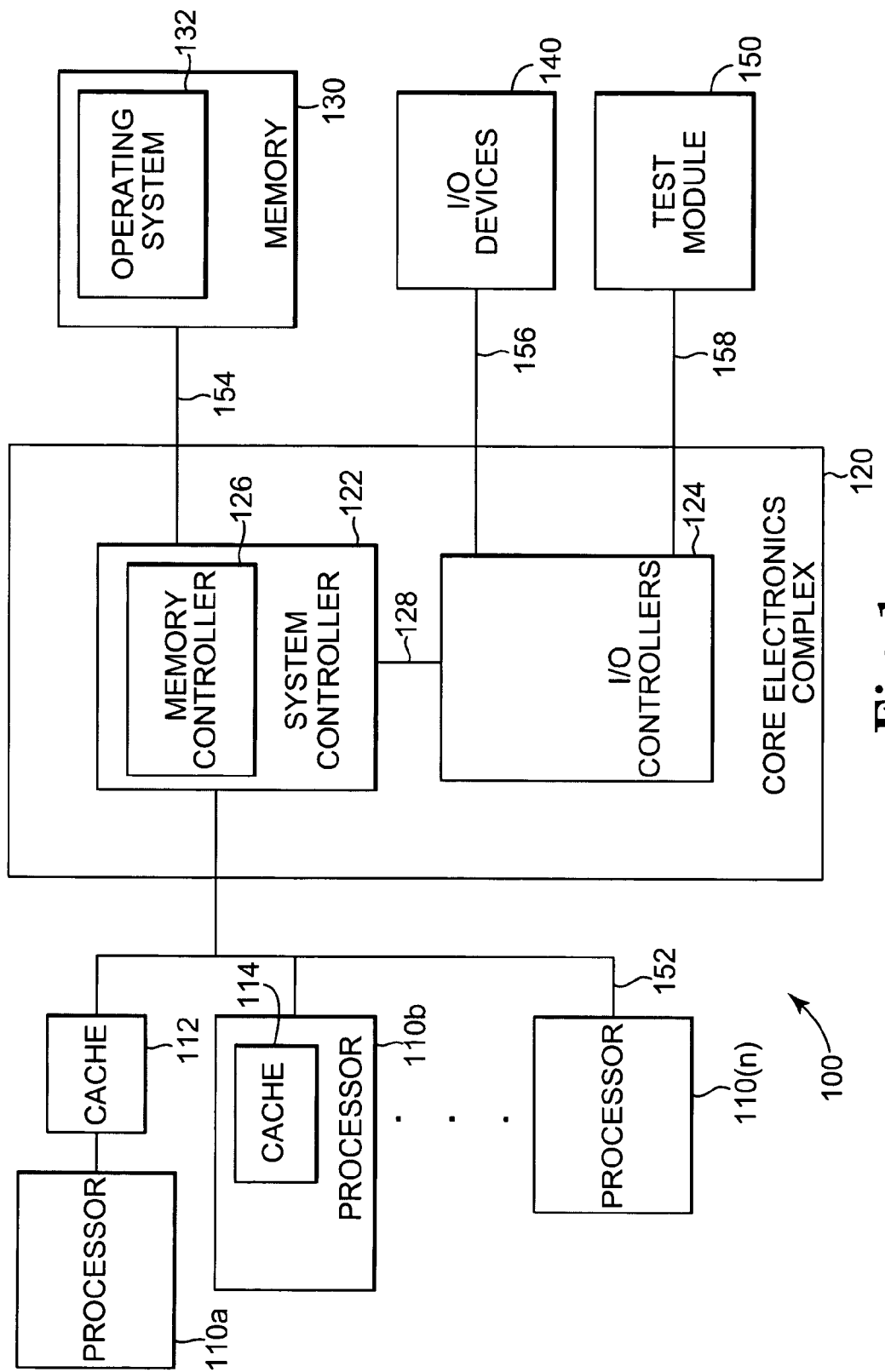
FIG. 1 is a block diagram illustrating an embodiment of a computer system that includes a test module for performing voltage margining tests on components of the computer system.

FIG. 1 is a block diagram illustrating an embodiment of a computer system 100 that includes a test module 150 for performing voltage margining tests on components of the computer system. Computer system 100 may be any type of computer system such as a handheld, desktop, notebook, mobile, workstation, or server computer. Computer system 100 includes processors 110a through 110(n), a core electronics complex 120, a memory 130, and a set of input/output (I/O) devices 140. Processors 110a through 110(n) are each coupled to core electronics complex 120 using a set of bus connections 152. Bus connections 152 comprise a set of system busses. Core electronics complex 120 is coupled to memory 130, I/O devices 140, and test module 150 using connections 154, 156, and 158, respectively. Core electronics complex 120 may also be referred to as a chipset.

Computer system 110a includes any number of processors 110 greater than or equal to one. As used herein, 'processor 110' refers to any one of processors 110a through 110(n), and 'processors 110' refers to the set of processors 110a through 110(n).

Processor 110a is coupled to a cache 112, and processor 110b includes a cache 114. Caches 112 and 114 may store any type of information such as instructions and data. Other processors 110 may include or be operable with any type or number of caches.

Computer system 100 also includes an operating system 132 that is executable by one or more of processors 110. In response to being turned on or reset, one or more of processors 110 cause operating system 132 to be booted and executed. Processors 110 execute instructions from operating system 132 and other programs using memory 130.

Core electronics complex 120 includes a system controller 122 coupled to a set of I/O controllers 124 using one or more connections 128. System controller 122 includes a memory controller 126 which is configured to store information into and read information from memory 130 in response to write and read transactions, respectively, from processors 110 and I/O devices 140. Memory controller 126 may include hardware and/or software configured to perform memory scrubbing or other error correction functions on memory 130 in response to reading information from memory 130.

I/O controllers 124 may include any type and number of controllers configured to manage one or more I/O devices 140. Examples of I/O controllers 124 include IDE/ATA controllers, SATA controllers, PCI controllers, SCSI controllers, USB controllers, IEEE 1394 (Firewire) controllers, PCMCIA controllers, parallel port controllers, and serial port controllers. In one embodiment, I/O controllers 124 comprise multiple microchips that include an intermediate bus coupled to system controller 122, PCI controllers coupled to the intermediate bus, and SCSI, IDE and others controllers coupled to the PCI controllers. As used herein, 'I/O controller 124' refers to a single I/O controller in I/O controllers 124, and 'I/O controllers 124' refers to the set of I/O controllers 124.

Memory 130 comprises any type of memory managed by memory controller 126 such as RAM, SRAM, DRAM, SDRAM, and DDR SDRAM. In response to commands from system firmware (not shown) or operating system 132, memory controller 130 may cause information to be loaded from an I/O device 140 such as a hard drive or a CD-ROM drive into memory 130.

I/O devices 140 may include any type and number of devices configured to communicate with computer system 100 using I/O controllers 124. Each I/O device 140 may be internal or external to computer system 100 and may couple to an expansion slot in a motherboard (not shown) or a connector in a chassis (not shown) that houses computer system 100 that is in turn coupled to an I/O controller 124. I/O devices 140 may include a network device (not shown) configured to allow computer system 100 to communicate with other computer systems and a storage device (not shown) configured to store information. As used herein, 'I/O device 140' refers to a single I/O device in I/O devices 140, and 'I/O devices 140' refers to the set of I/O devices 140.

Test module 150 couples to an expansion slot (not shown) in computer system 100 and operates using an I/O controller 124, such as an I2C controller, coupled to the expansion slot. Test module 150 operates to cause tests to be performed on components of computer system 100 during operation, i.e., subsequent to operating system 132 being booted, of computer system 100 using voltage margining. In the embodiment shown in FIG. 1, test module 150 is configured to perform tests on components such as processors 110 and I/O devices 140 using voltage margining.

Voltage margining refers to the process of testing a component over a range of voltages at or near the voltage at which the component is designed to operate. For example, a component that normally operates using a voltage of 5.0V may be tested over a range of +/−10% of the nominal 5.0V, i.e., from 4.5V to 5.5V. The range of voltages used to test a component may depend on the type of component or on the nominal operating voltage of the component.

To perform voltage margining tests, test module 150 communicates with operating system 132 to a component to be de-allocated from use by operating system 132. Test module 150 may initiate tests on its own periodically or may initiate the tests in response to signals from a processor 110 or operating system 132. After a component has been de-allocated, test module 150 causes one or more selected voltages to be applied to the component and causes tests to be performed on the component at each selected voltage. If any errors are detected from the tests, test module 150 causes remedial action to be taken such as causing the component to remain de-allocated and/or notifying the operating system or a system administrator of the errors.

FIGS. 2a, 2b, and 2c are block diagrams illustrating embodiments of selected portions of computer system 100. In particular, FIGS. 2a, 2b, and 2c illustrate three possible ways in which test module 150 operates to cause voltage margining tests to be performed on a component, referred to as a test device 206, in computer system 100 after the component has been de-allocated from use by operating system 132.

In each of the embodiments shown in FIGS. 2a, 2b, and 2c, test module 150 provides voltage select signals to digital-to-analog converter 202 to cause a selected voltage level to be applied to test device 206 using a connection 212. Digital-to-analog converter 202 receives the voltage select signals from test module 150 and generates a trim signal in response to the voltage select signals. Digital-to-analog converter 202 provides the trim signal to a power supply 204 using a connection 214. In response to receiving the trim signal, power supply 204 generates a voltage level and provides the voltage level to test device 206 using a connection 216.

After a selected voltage level is applied to test device 206, test module 150 causes tests to be performed on test device 206.

In the embodiment of FIG. 2a, test module 150 causes tests to be performed on test device 206 by communicating directly with test device 206 using a connection 218. Connection 218 may be a PCI bus, for example, and test module 150 and test device 206 may be PCI devices. The tests include a series of inputs or test patterns generated by test module 150 and provided to test device 206. Test module 150 detects the outputs from test device 206 in response to the inputs or test patterns to detect failures in test device 206 at the selected voltage.

In the embodiment of FIG. 2b, test module 150 causes tests to be performed on test device 206 by communicating with test device 206 using memory 130 or another suitable memory (not shown). Test module 150 provides inputs or test patterns to test device 206 by storing information in memory 130 using a connection 222. Test device 206 receives the information using a connection 224, generates outputs in response to the information, and stores the outputs in memory 130. Test module 150 accesses the outputs from memory 130 to detect failures in test device 206 at the selected voltage.

In the embodiment of FIG. 2c, test module 150 causes processor 110 to perform tests on test device 206. Test module 150 initiates the tests by providing a signal to processor 110 using a connection 232. The tests comprise software routines executable by processor 110 to cause inputs or test patterns to be provided to test device 206 using a connection 234. Test device 206 generates outputs in response to the inputs or test patterns and stores the outputs in memory 130. Test module 150 accesses the outputs from memory 130 to detect failures in test device 206 at the selected voltage. Alternatively, processor 110 may accesses the outputs from memory 130 to detect failures in test device 206 and provide signals to test module 150 to indicate whether a failure occurred.

After tests are performed at a selected voltage level, test module 150 may cause another selected voltage level to be applied to test device 206 and perform tests at this other selected voltage level in each of the embodiments shown in FIGS. 2a, 2b, and 2c.

Figure 3:
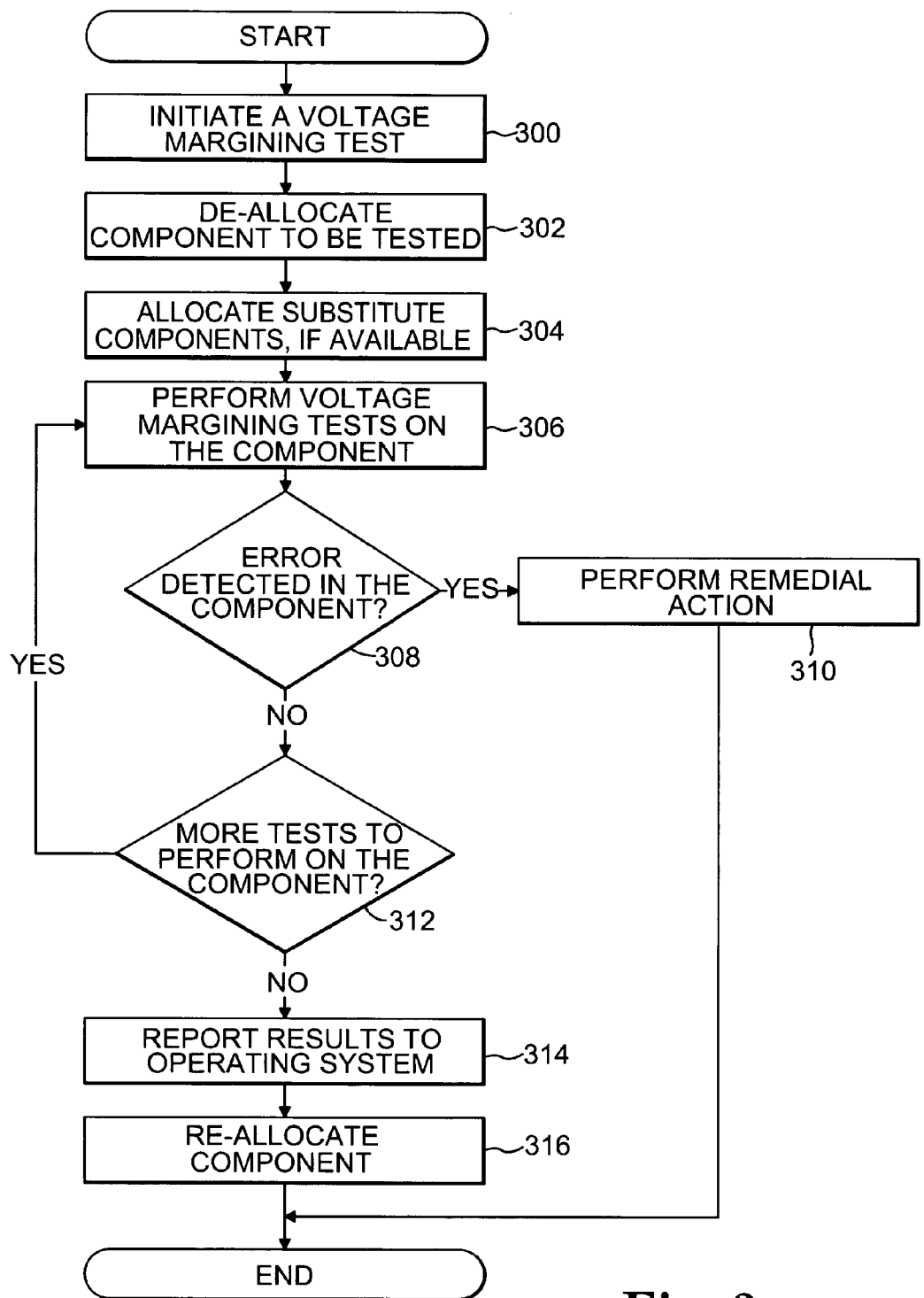
FIG. 3 is a flow chart illustrating an embodiment of a method for testing a component of a computer system using voltage margining.

FIG. 3 is a flow chart illustrating an embodiment of a method for testing a component of computer system 100 by test module 150 using voltage margining. A voltage margining test is initiated by operating system 132 or test module 150 as indicated in a block 300. Voltage margining tests may be scheduled periodically and may be scheduled in response to selections made by user interacting with operating system 132.

A component to be tested is de-allocated from use by operating system 132 as indicated in a block 302. Test module 150 may send a request or other signal to operating system 132 to cause the component to be de-allocated. Operating system 132 may respond by providing a signal back to test module 150 to indicate that the component has been de-allocated, i.e., that the component is available for testing by test module 150. A substitute component is allocated to replace the de-allocated component, if available, as indicated in a block 304.

Voltage margining tests are performed on the component by test module 150 as indicated in a block 306. Test module 150 performs voltage margining tests causing a power supply coupled to the component to provide a selected voltage to the component and then testing the operation of the component. A determination is made as to whether an error has been detected in the component by test module 150 as indicated in a block 308. To detect an error, test module 150 may compare test outputs received from the component to expected outputs. If an error has been detected in the component, then remedial action, such as notifying operating system 132 and/or a system administrator or keeping the component offline, is performed as indicated in a block 310.

If no error has been detected in the component, then a determination is made as to whether there are more tests to perform on the component as indicated in a block 312. If there are more tests to be performed on the component, then the function of block 306 is repeated as indicated. If there are no more tests to be performed on the component, then results are reported to operating system 132 by test module 150 as indicated in a block 314. The component is re-allocated as indicated in a block 316.

Figure 4:
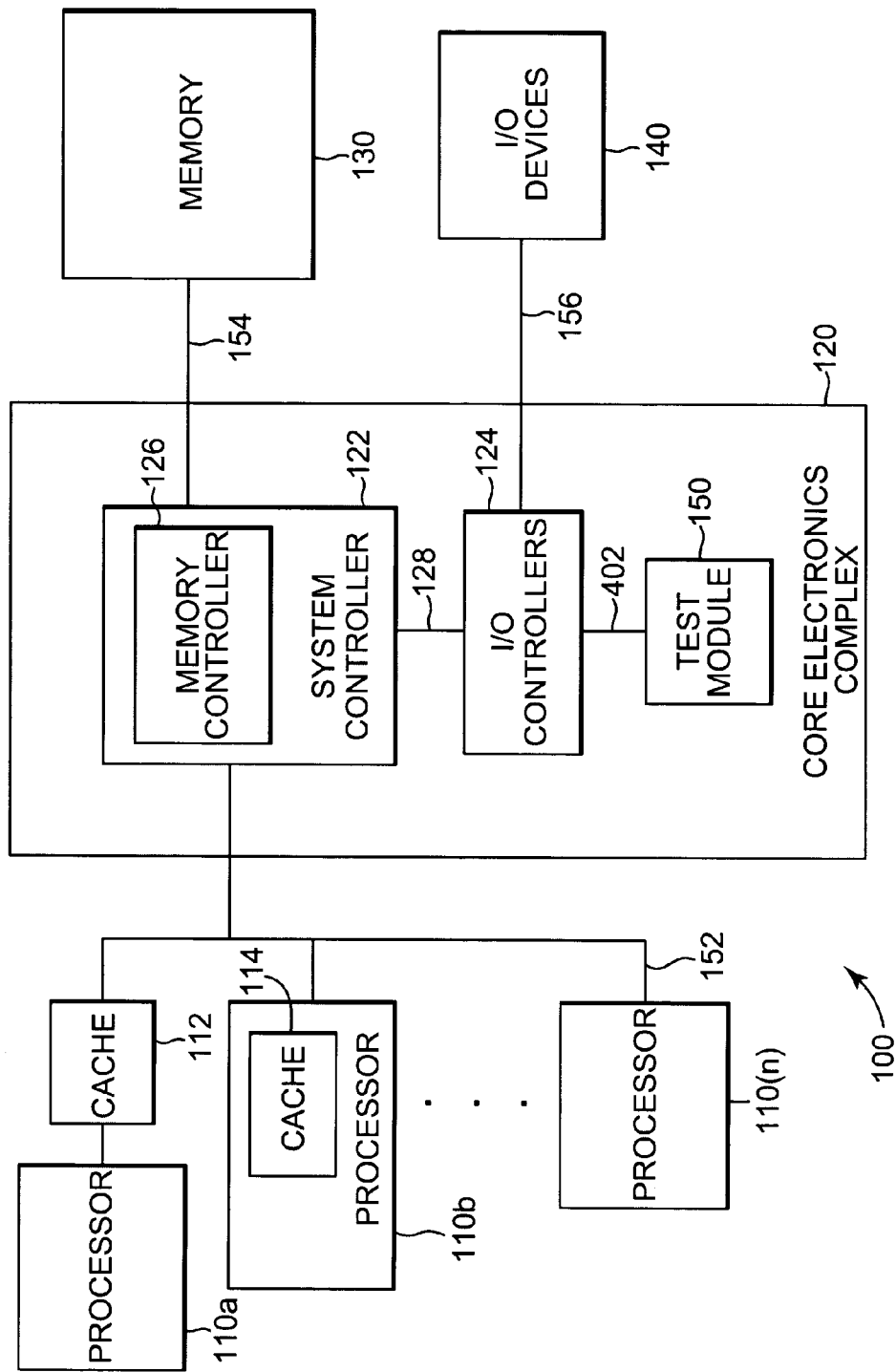
FIG. 4 is a block diagram illustrating an alternative embodiment of a computer system that includes a test module for performing voltage margining tests on components of the computer system.

FIG. 4 is a block diagram illustrating an alternative embodiment of computer system 100 that includes test module 150 for performing voltage margining tests on components of computer system 100. In the embodiment of FIG. 4, test module 150 operates in substantially the same way as described above. In FIG. 4, however, test module 150, however, is included as part of core electronics complex 120 and couples to either an I/O controller 124 (as shown in FIG. 4) or directly to system controller 122 (not shown). As illustrated in FIG. 4, test module 150 may be located in various places in computer system 100.

In the embodiments described herein, test module 150 and the components therein may comprise hardware, software, or any combination of hardware and software.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A computer system comprising:
   a first processor configured to cause an operating system to be booted;
   a test module;
   a component coupled to the test module; and
   a power supply coupled to the test module and the component;
   wherein the test module is configured to cause a first signal to be provided to the power supply to cause a first voltage to be provided to the component, wherein the test module is configured to cause a first test to be performed on the component subsequent to the first voltage being provided to the component and the operating system being booted, wherein the test module is configured to cause a second signal to be provided to the power supply to cause a second voltage to be provided to the component, and wherein the test module is configured to cause a second test to be performed on the component subsequent to the second voltage being provided to the component and the operating system being booted.

2. The computer system of claim 1 wherein the component is configured to operate at a third voltage, wherein the first voltage is greater than the third voltage, and wherein the second voltage is less than the third voltage.

3. The computer system of claim 2 wherein the first voltage is approximately 10% greater than the third voltage, and wherein the second voltage is approximately 10% less than the third voltage.

4. The computer system of claim 1 wherein the test module is configured to provide a third signal to the operating system to cause the component to be de-allocated from use by the operating system.

5. The computer system of claim 4 wherein the operating system is configured to provide a fourth signal to the test module in response to causing the component to be de-allocated from use by the operating system.

6. The computer system of claim 1 wherein the test module is configured to detect an error in the component in response to the first test being performed, and wherein the test module is configured to cause remedial action associated with the component to be performed in response to detecting the error.

7. The computer system of claim 1 wherein component comprises a second processor.

8. The computer system of claim 1 wherein component comprises an input/output (I/O) device.

9. The computer system of claim 1 further comprising:
   an input/output (I/O) controller coupled to the component;
   wherein the test module is coupled to the I/O controller.

10. The computer system of claim 9 wherein the I/O controller comprises an I2C controller.

11. A method performed by a test module in a computer system comprising:
   causing a first component to be de-allocated from use by an operating system;
   causing a first voltage to be applied to the first component;
   performing a first test on the first component;

notifying the operating system in response to detecting a first error in performing the test;
causing a second voltage that differs from the first voltage to be applied to the first component;
performing a second test on the first component; and
notifying the operating system in response to detecting a second error in performing the second test.

12. The method of claim 11 further comprising:
causing the first component to be re-allocated for use by the operating system subsequent to performing the first test.

13. The method of claim 11 further comprising:
reporting results of the first test to the operating system.

14. The method of claim 11 further comprising:
allocating a second component for use by the operating system in response to de-allocating the first component from use by the operating system.

15. A computer system comprising:
a processor configured to cause an operating system to be booted;
a component;
a power supply coupled to the component;
a first means for providing a first signal to be provided to the power supply to cause a first voltage to be provided to the component; and
a second means for causing a first test to be performed on the component subsequent to the first voltage being provided to the component and the operating system being booted;
wherein the first means is for providing a second signal to the power supply to cause a second voltage to be provided to the component, and wherein the second means is for causing a second test to be performed on the component subsequent to the second voltage being provided to the component and the operating system being booted.

16. The computer system of claim 15 wherein the second means is for providing a third signal to the operating system to cause the component to be de-allocated from use by the operating system.

17. The computer system of claim 15 wherein the second means is for detecting an error in the component in response to the first test being performed, and wherein the second means for causing remedial action associated with the component to be performed in response to detecting the error.

18. The method of claim 11 further comprising:
causing the first component to be de-allocated from use by the operating system by providing a first signal to the operating system; and
receiving a second signal from the operating system indicating that the component has been de-allocated from use by the operating system prior to performing the first test.

19. The computer system of claim 16 wherein the operating system is configured to provide a fourth signal to the second means in response to causing the component to be de-allocated from use by the operating system.

20. A computer system comprising:
a processor configured to cause an operating system to be booted;
a test module;
a component coupled to the test module; and
a power supply coupled to the test module and the component;
wherein the test module is configured to cause a first signal to be provided to the power supply to cause a first voltage to be provided to the component, wherein the test module is configured to cause a first test to be performed on the component subsequent to the first voltage being provided to the component and the operating system being booted, wherein the test module is configured to provide a second signal to the operating system to cause the component to be de-allocated from use by the operating system, and wherein the operating system is configured to provide a third signal to the test module in response to causing the component to be de-allocated from use by the operating system.

21. The computer system of claim 20 wherein the test module is configured to cause a fourth signal to be provided to the power supply to cause a second voltage to be provided to the component, and wherein the test module is configured to cause a second test to be performed on the component subsequent to the second voltage being provided to the component and the operating system being booted.

22. The computer system of claim 21 wherein the component is configured to operate at a third voltage, wherein the first voltage is greater than the third voltage, and wherein the second voltage is less than the third voltage.

23. The computer system of claim 20 wherein the test module is configured to detect an error in the component in response to the first test being performed, and wherein the test module is configured to cause remedial action associated with the component to be performed in response to detecting the error.

24. The computer system of claim 20 wherein the test module is configured to provide a fourth signal to the operating system to cause the component to be allocated for use by the operating system subsequent to causing the first test to be performed on the component.

* * * * *